United States Patent
Tai et al.

(10) Patent No.: US 11,616,029 B2
(45) Date of Patent: Mar. 28, 2023

(54) DELAMINATION SENSOR

(71) Applicant: Taiwan Semiconductor Manufacturing Company, Ltd., Hsinchu (TW)

(72) Inventors: Chih-Hsuan Tai, Hsinchu (TW); Ming-Chung Wu, Hsinchu (TW); Kuo-Wen Chen, Hsinchu (TW); Hsiang-Tai Lu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 44 days.

(21) Appl. No.: 17/365,699

(22) Filed: Jul. 1, 2021

(65) Prior Publication Data

US 2022/0375877 A1 Nov. 24, 2022

Related U.S. Application Data

(60) Provisional application No. 63/192,187, filed on May 24, 2021.

(51) Int. Cl.
*H01L 23/58* (2006.01)
*H01L 23/528* (2006.01)
*H01L 23/522* (2006.01)
*H01L 23/498* (2006.01)

(52) U.S. Cl.
CPC ...... *H01L 23/585* (2013.01); *H01L 23/49816* (2013.01); *H01L 23/528* (2013.01); *H01L 23/5226* (2013.01)

(58) Field of Classification Search
CPC ............ H01L 23/585; H01L 23/49816; H01L 23/5226; H01L 23/528
USPC ........................................................ 257/760
See application file for complete search history.

(56) References Cited

U.S. PATENT DOCUMENTS 7,716,992 B2 * 5/2010 Maloney ............... H01L 23/585
                                                        73/777
10,861,810 B2   12/2020 Huang et al.
2020/0395398 A1 12/2020 Kao

FOREIGN PATENT DOCUMENTS

CN  104347576 A   2/2015
EP    3671830 A1  6/2020
TW  202038396 A  10/2020

* cited by examiner

*Primary Examiner* — Tu-Tu V Ho
(74) *Attorney, Agent, or Firm* — Haynes and Boone, LLP

(57) ABSTRACT

Semiconductor structures and methods of testing the same are provided. A semiconductor structure according to the present disclosure includes a substrate, a semiconductor device over the substrate, wherein the semiconductor device includes an interconnect structure, and the interconnect structure includes a plurality of metallization layers disposed in a dielectric layer; and a delamination sensor. The delamination sensor includes a connecting structure and a plurality of contact vias in at least one of the plurality of metallization layers. The connecting structure bonds the semiconductor device to the substrate and does not functionally couple the semiconductor device to the substrate. The plurality of contact vias fall within a first region of a vertical projection area of the connecting structure but do not overlap a second region of the vertical projection area.

20 Claims, 13 Drawing Sheets

| Sensor Level | 1 | 2 | 3 | 4 | 5 |
|---|---|---|---|---|---|
| Empty size L: UBM dia. | 9% (0.11L×0.11L) | 16% (0.20L×0.20L) | 25% (0.32L×0.32L) | 36% (0.46L×0.46L) | 49% (0.62L×0.62L) |
| Sensitivity level | Low | | | | High |

DELAMINATION SENSOR

PRIORITY DATA

This application claims priority to U.S. Provisional Patent Application Ser. No. 63/192,187, filed May 24, 2021, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor industry, an IC chip may be bonded to a package substrate before the package substrate is bonded to a printed circuit board (PCB). The IC chip and the package substrate have different coefficients of thermal expansion (CTEs). During or after fabrication processes, the IC chip and the package substrate may expand and contract differently, causing chip-package-interaction (CPI) issues. CPI issues include delamination of metallization layers, which leads to device failure. CPI issues may be hard to detect and a whole-chip scan using C-mode scanning acoustic microscopy (C-SAM) may be time-consuming and costly.

As functional density continues to increase, parasitic capacitance plays a more significant role in device performance. To reduce parasitic capacitance, extreme low-k (ELK) dielectric material are used in interconnect structures to reduce resistive-capacitive (RC) delay. The adoption of ELK material exacerbates CPI issues because ELK materials do not withstand stress as non-ELK materials do. While existing chip packages are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
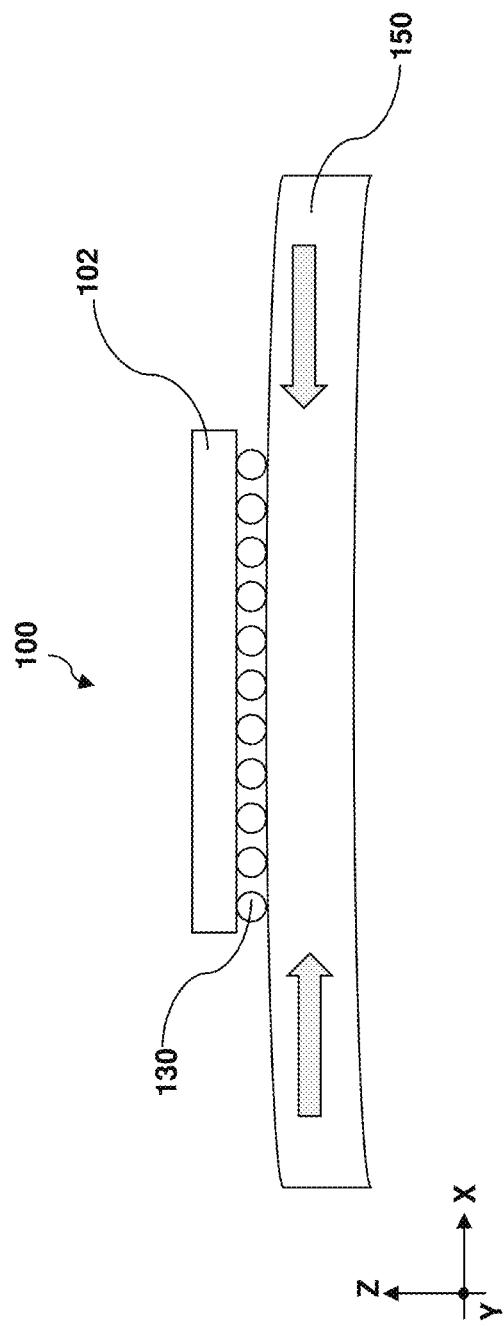
FIG. 1 is a cross-sectional view of a semiconductor device package, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In some device packaging technologies, a semiconductor chip (or IC chip) is bonded to a package substrate to form a semiconductor device package and the semiconductor device package is then bonded to a printed circuit board (PCB). The semiconductor chip and the package substrate haver different material properties. On the one hand, the semiconductor chip is formed primarily of semiconductor materials (such as silicon, germanium, silicon germanium, or III-V semiconductors), semiconductor oxide (such as silicon oxide), and semiconductor nitride (such as silicon nitride). The package substrate, on the other hand, may be a laminated substrate that includes polymeric materials and metals. For example, the package substrate may be fabricated from, for example, polyimide, PTFE, a polymer composite laminate, such FR-2 and FR-4, an organic (laminate) material such as bismaleimide-triazine (BT), a polymer-based material such as liquid-crystal polymer (LCP), or the like. The package substrate may also include traces/lines that are formed from suitable conductive materials, such as copper, aluminum, silver, gold, other metals, alloys, combination thereof. As a result, a CTE of the package substrate may be about 2 times to about 10 times of a CTE of the IC chip.

Figure 2:
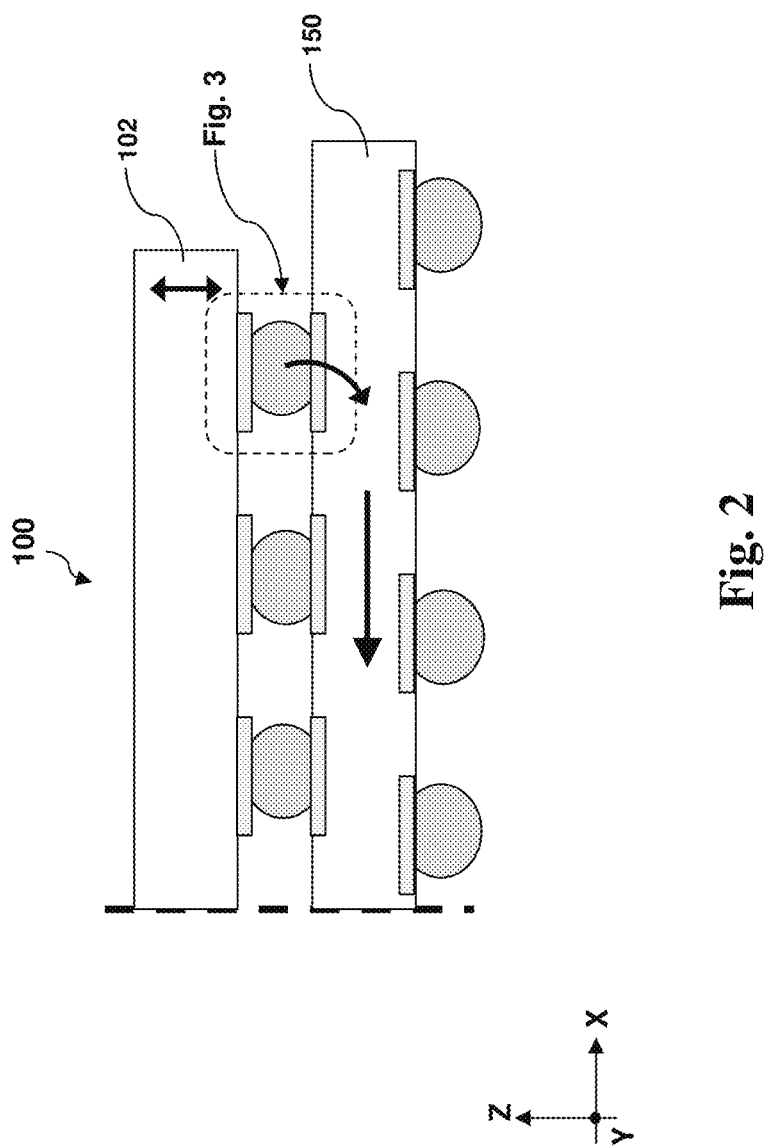
FIG. 2 is a fragmentary cross-sectional view of a semiconductor device package, according to various aspects of the present disclosure.

An example semiconductor device package 100 is shown in FIG. 1. The semiconductor device package 100 includes an IC chip 102 that is flipped over and bonded to a package substrate 150 by solder bumps 130. The IC chip 102 may also be referred to as a semiconductor chip 102 or a semiconductor device 102. The semiconductor device package 100 may be subject to elevated temperature, for example, during solder reflow process. When the semiconductor device package 100 is cooled down to room temperature, the package substrate 150 may contract along the Y direction a lot more than the IC chip 102, as indicated by the arrows in FIG. 1. Reference is now made to FIG. 2, which illustrates an enlarged cross-sectional view of an edge of the IC chip 102 and the package substrate 150. As indicated by the arrows, because the IC chip 102 is bonded to the package substrate 150, the deformation may exert stress on the IC chip 102 by way of the solder connections. The result is that the IC chip is subject to a tensile stress along the Z direction. As the amount of thermal expansion increases with the distance from a stress neutral point, which is usually the geometric center of the IC chip 102, the tensile stress may reach its maximum near edges and corners of the IC chip 102. In layman's terms, the mismatch of CTEs of the IC chip 102 and the package substrate 150 may pull edges and corners of the IC chip 102 downward through the solder connections.

Figure 3:
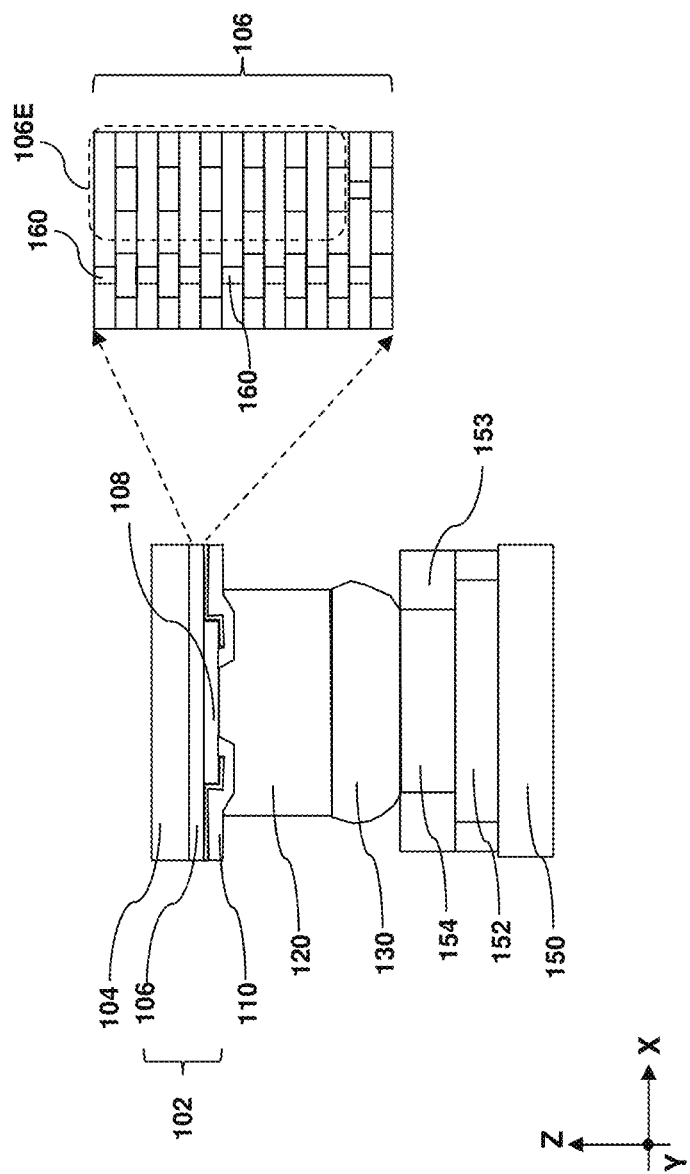
FIG. 3 is enlarged fragmentary cross-sectional view of a connecting structure that bonds a semiconductor device package to a semiconductor device, according to various aspects of the present disclosure.

FIG. 3 illustrates an enlarged fragmentary cross-sectional view of a solder connection between the IC chip 102 and the package substrate 150. The IC chip 102 includes a semiconductor substrate 104, an interconnect structure 106 over the semiconductor substrate 104, a contact pad 108 over the interconnect structure 106, a passivation layer 110 over the contact pad 108, an under-bump metallization (UBM) feature 120 coupled to the contact pad 108, and a solder feature 130 over the UBM feature 120. The semiconductor substrate 104 may include crystalline silicon, crystalline germanium, crystalline silicon germanium, and/or a III-V compound semiconductor such as GaAsP, AlInAs, AlGaAs, GaInAs, GaInP, GaInAsP, or the like. While not explicitly shown in FIG. 3, the semiconductor substrate 104 may include front-end-of-line (FEOL) semiconductor features, such as transistors and MEOL contact features, such as gate contact vias, source/drain contact, source/drain contact vias. The interconnect structure 106 may include about 10 and about 15 metallization layers, such as about 13 metallization layers. A representative fragmentary interconnect structure 106 is also provided in FIG. 3. The metallization layers of the interconnect structure 106 is embedded in a plurality of inter-metal dielectric (IMD) layers that may be formed of low-k (LK) or extreme low-k (ELK) dielectric materials. Low-k dielectric materials refer to dielectric materials with a dielectric constant smaller than that of silicon dioxide, which is about 3.9. Example low-k dielectric materials may include Phosphosilicate Glass (PSG), Boroilicate Glass (BSG), Boron-Doped Phosphosilicate Glass (BPSG), Fluorine-Doped Silicate Glass (FSG), Tetraethyl orthosilicate (TEOS). ELK dielectric materials refer to dielectric materials with a dielectric constant smaller than 2.7. Example ELK dielectric materials include porous organosilicate glass. The metallization layers may include copper (Cu) or titanium nitride (TiN).

The contact pad 108 may be formed of aluminum (Al) or aluminum copper (Al—Cu) and may be referred to as aluminum pad. The passivation layer 110 may be a multi-layer that includes one or more polyimide layers, one or more silicon nitride layer, or a combination of both. The UBM feature 120 may include multiple layers, such as a barrier layer, a seed layer and a metal bump. In some embodiments, the UBM feature may include titanium, titanium nitride, nickel, cupronickel, cobalt, copper, or a combination thereof. The solder feature 130 may also be referred to as a solder bump 130. In some embodiments, the solder feature 130 may include Pb—Sn, InSb, tin, silver, copper, or a combination thereof. The UBM feature 120 and the solder feature 130 may be collectively referred to as a connecting structure. The connecting structure comes into contact with the package substrate 150 by way of a pre-solder feature 154 that includes alloys of tin, lead, silver, copper, nickel, bismuth, or combinations thereof. The pre-solder feature 154 may be embedded in a solder mask 153, which is formed of solder resist material layer, a dielectric layer, a polymer layer, or any other materials that do not chemically react with solder materials. The pre-solder feature 154 is disposed on a contact pad 152 over the package substrate 150. The contact pad 152 may include copper, aluminum, or aluminum-copper.

Figure 4:
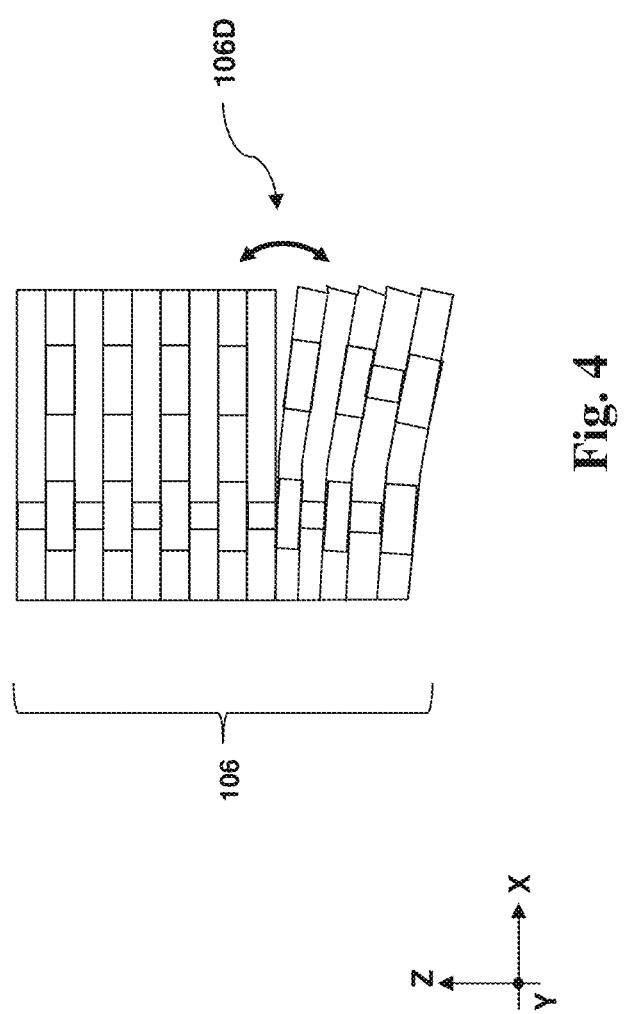
FIG. 4 is enlarged fragmentary cross-sectional view of an interconnect structure in the semiconductor device, according to various aspects of the present disclosure.

Reference is still made to FIG. 3. In some example, a via empty region 106E may be present in the interconnect structure 106. As shown in FIG. 3, the via empty region 106E refers to a vertical projection area through consecutive layers of metallization layers where there are no contact vias 160. Experiments and field data show that when via empty region 106E falls within chip corner or chip edge regions where the tensile stress is higher than the rest of the IC chip, delamination 106D representatively shown in FIG. 4 is more likely take place. Central regions of IC chips are not immune to delamination, albeit for different reasons. In some instances, polymer materials in the package substrate 150 may expand, causing the central regions to delaminate. Delamination 106D may lead to connection failure and device failure. Because the tensile stress may dissipate away from the UBM feature 120, delamination 106D is likely to occur within six metallization layers from the UBM feature 120. For example, when the interconnect structure 106 includes 13 metallization layers and the 13th layer is closer to the UBM feature 120, the delamination 106D is likely to take place within the 13th, 12th, 11th, 10th, 9th, and 8th metallization layers, provided that they are embedded in LK or ELK dielectric materials. In instances where the higher layers, such as the 13th and the 12th layer, are embedded in silicon oxide or other non-ELK dielectric materials, the delamination 106D is more likely to be found in the 11th, 10th, 9th, or 8th layer.

Figure 5:
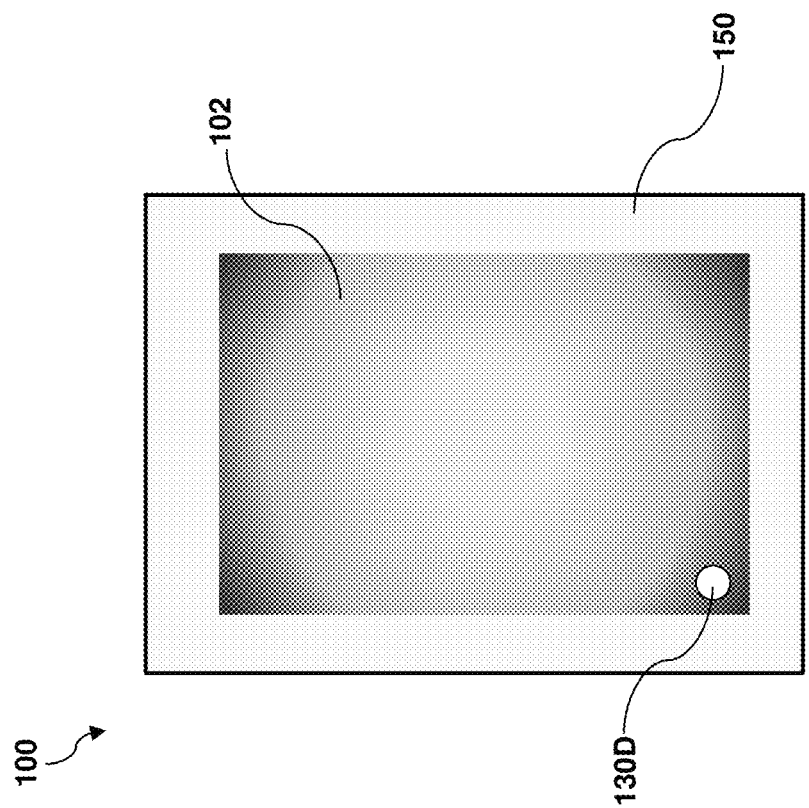
FIG. 5 is a top view of a semiconductor device package, according to one or more aspects of the present disclosure.

C-mode scanning acoustic microscopy (C-SAM) may be used to detect chip-package interaction (CPI) related failures such as delamination shown in FIG. 4. Delamination manifests in a C-SAM scan as a visible white halo or circle around a connecting structure. For that reasons, delamination may be referred to as a white bump (WB). WBs are the indicator of a CPI-related failure event in a semiconductor device package. An example local delamination or white bump 130D is illustrated in FIG. 5, which represents a C-SAM image or a top view of the semiconductor device package 100. As powerful as modern-day C-SAM is, a full IC chip C-SAM scan can take between about 15 minutes and about 30 minutes. It explains that most manufacturers may test random samples, not all IC chips. Otherwise the testing may substantially reduce production throughput and increase the production cost of the semiconductor device package 100. Existing electrical testing does not effectively detect delamination because the probed UBM feature is rarely also an UBM feature directly over delamination. That is, a semiconductor device package 100 that passes electrical testing may very well be one infested with delamination and open circuits.

The present disclosure provides delamination sensors that may reliably detect CPI-related failures such as delamination and a cost-effective way to check the quality of a semiconductor device package, such as ones similar to the semiconductor device package 100 shown in FIGS. 1, 2 and 5. Because delamination defects are also referred to as white bumps or white bump defects, Delamination sensors of the present disclosure may also be referred to as white bump (WB) sensors. Sensitivities of WB sensors of the present disclosure are tunable to meet different design needs and provide reliable WB failure readings. WB sensors may be coupled with design-for-testing features such as electrical continuity loops to allow direct electrical probing. Besides direct electrical testing, WB sensors can be tested using C-SAM as well. According to the present disclosure, because WB sensors are where the lamination is most likely to take place, only the WB sensors need to be scanned or probed to verify quality of the entire semiconductor device package. Compared to full-chip C-SAM scan or electrical testing that tells little of delamination, testing methods of the present disclosure are more cost-effective and reliable.

Generally speaking, the WB sensors or delamination sensors of the present disclosure are analogous to canaries in coal mines or chemical plants. Canaries are far more sensitive to poisonous gases than humans. Sudden agitation or stoppage of loud chirping of a canary can reliably indicate presence of a poisonous gas. The WB sensors of the present disclosure are UBM connection structures that are directly over intentionally weakened structures. The intentionally weakened underlying structure makes the WB sensor tend to fail before other UBM connection structures fail. As described above, the tensile stress is exerted to the interconnect structure 106 by way of the UBM features 120. Experiments and field data show location of a UBM feature 120, a size of a via empty region and orientation of the via empty region determine whether the UBM feature 120 will appear as a white bump during C-SAM. First, delamination-causing tensile stress increases with distance from the stress-neutral geometric center of the IC chip 102. It means that UBM features 120 near edges or corners of the IC chip 102 tend to exert the highest tensile stress on the portion of interconnect structure 106 connected thereto. The greater stress means a higher likelihood of a white bump. Second, contact vias are critical in holding metallization layers together. When there are more contact vias or when contact vias are densely populated, delamination is less likely. Conversely, when contact vias are missing in an area of consecutive metallization layers, that area may become weaker in terms of resistance to tensile stress. Third, orientation of a via empty region relative to a geometric center of the IC chip matters. When the via empty region is disposed between a geometric center of the IC chip and a geometric center of the UBM feature, delamination is less likely. However, when the via empty region is oriented away from the geometric center of the IC chip, probability of delamination may increase by between 10% and about 25%. According to the present disclosure, a UBM feature 120 of a WB sensor may be a dummy UBM feature, a filler UBM feature, or a redundant UBM feature that serves functions similar to at least one other UBM feature.

Figure 6:
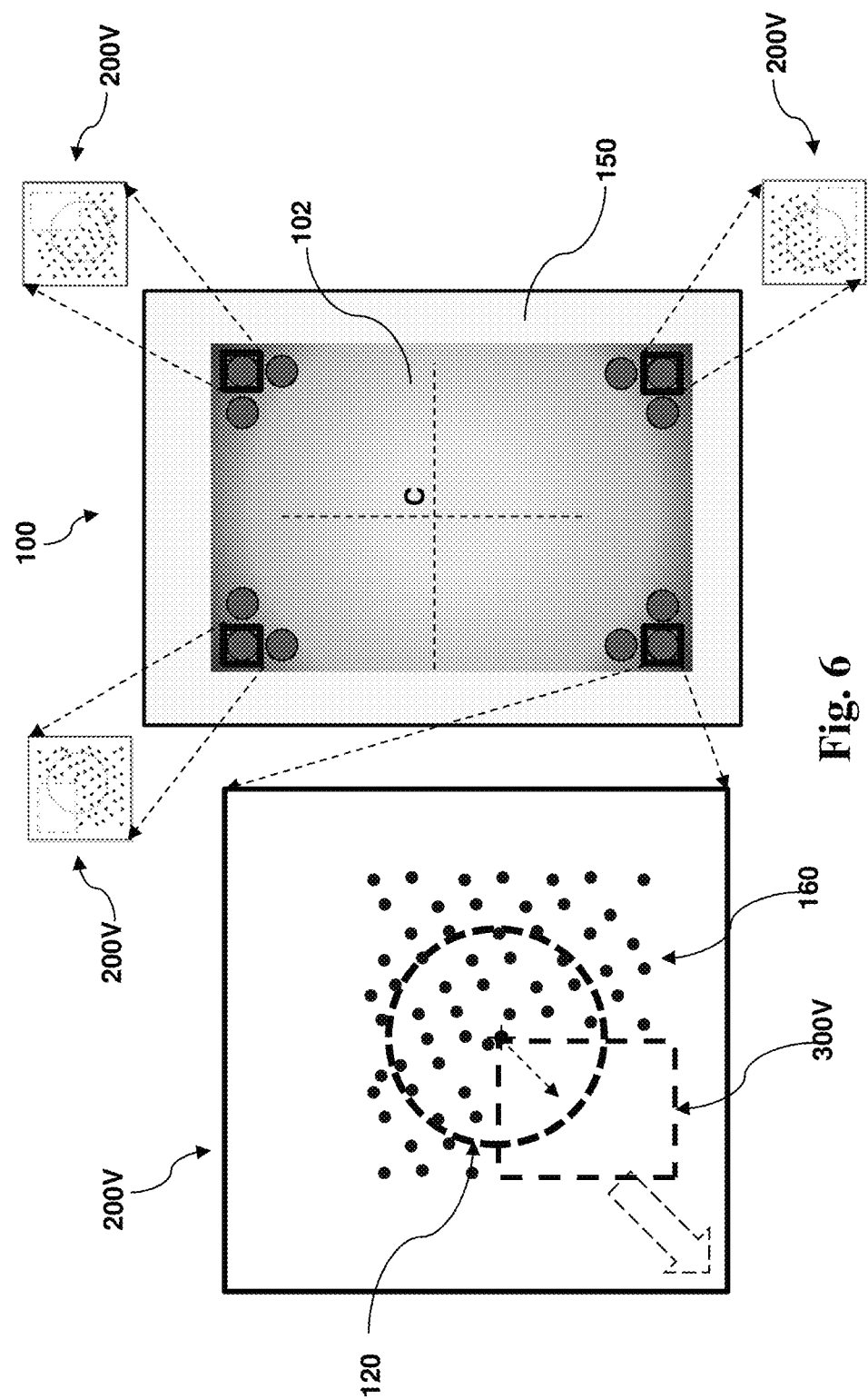
FIGS. 6-10 illustrate various embodiments of delamination sensors, according to one or more aspects of the present disclosure.

In some embodiments represented in FIG. 6, the semiconductor device package 100 may include one or more corner WB sensors 200V adjacent one or more corners of the IC chip 102. In the depicted embodiments, the IC chip 102 is rectangular in shape and its 4 corners are areas that are farthest away from a geometric center C, which is usually a stress neutral point. When deployed, the corner WB sensors 200V are placed adjacent the 4 corners of the IC chip 102. The corner WB sensors 200V are placed closer to the 4 corners than to the geometric center C. In the depicted embodiments, more than one corner WB sensors 200V, such as three corner WB sensors 200V, are placed adjacent one corner. Each of the corner WB sensors 200V includes an UBM feature 120, a plurality of contact vias 160 that fall within a vertical projection area of the UBM feature 120, and a corner via empty region 300V. The plurality of contact vias 160 that fall within the vertical projection area of the UBM feature 120 are disposed in the plurality of metallization layers in the interconnect structure 106. The corner via empty region 300V is a region of the vertical projection area that do not overlap any contact vias in at least two consecutive metallization layers of the first six metallization layers from the UBM feature 120. The corner via empty region 300V overlaps a quadrant that is between a geometric center of the UBM feature 120 and a closest corner of the IC chip 102. For example, a corner via empty region 300V overlaps the lower-left quadrant of the projection area of the UBM feature 120 in the lower left corner. The semiconductor device package 100 in FIG. 6 includes corner WB sensors 200V in the other three corners—the top left corner, right lower corner, and the top right corner. The corner via empty region 300V overlaps the top left quadrant of the projection area of the UBM feature 120 in the top left corner. The corner via empty region 300V overlaps the lower left quadrant of the projection area of the UBM feature 120 in the lower left corner. The corner via empty region 300V overlaps the lower right quadrant of the projection area of the UBM feature 120. In some embodiments, each corner via empty region 300V may be rectangular in shape and may expand beyond a quadrant of the projection area of the UBM feature 120.

Figure 7:
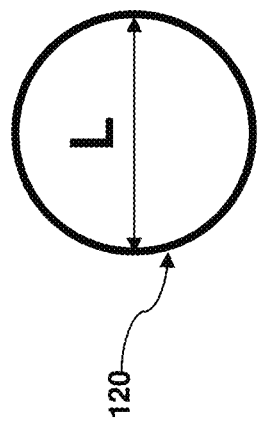

Reference is now made to FIG. 7. The sensitivity of the corner WB sensor 200V is tunable. For example, with respect to an UBM feature 120 that has a diameter L, a corner via empty region 300V may have equal sides that is each a fraction of the diameter L, such as 0.11L, 0.20L, 0.32L, 0.46L, and 0.62L. The sensitivity of a corner WB sensor 200V increases when an area of the corner via empty region 300V increases. Additionally, the sensitivity of a corner WB sensor 200V increases when the consecutive via-free layers in the corner via empty region 300V increases or when the consecutive via-free layers are closer to the UBM feature 120. For example, among two otherwise identical corner WB sensors 200V, the one with 4 consecutive via-free layers is more sensitive than the other with 2 consecutive via-free layers. For another example, between two otherwise identical corner WB sensors 200V, one with 2 consecutive via-free layers in the 10th and 11th metallization layers is more sensitive than the other with 2 consecutive via-free layers in the 8th and 9th metallization layers. It is noted while these tunable parameters are described with respect to corner WB sensors 200V, they may be applied to tune sensitivities of other WB sensors of the present disclosure.

Figure 8:
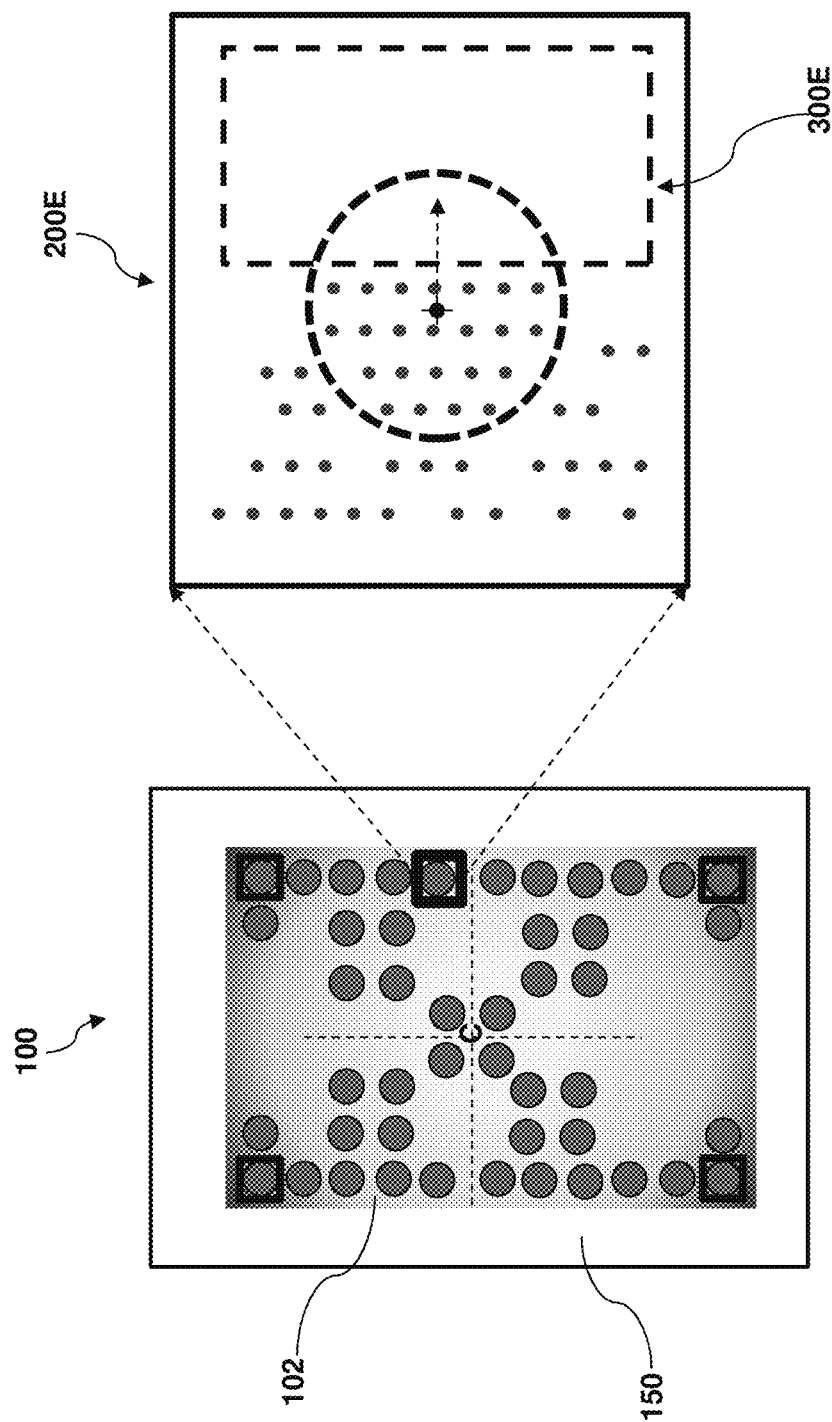

In some embodiments represented in FIG. 8, the semiconductor device package 100 may include an edge WB sensor 200E adjacent an edge of the IC chip 102. In the depicted embodiments, the IC chip 102 is rectangular in shape and its 4 edges/sides are relatively far away from a geometric center C, which is usually a stress neutral point. When deployed, at least one edge WB sensor 200E is placed adjacent at least one of 4 edges of the IC chip 102. An edge WB sensors 200E according to the present disclosure is placed closer to an edge than to the geometric center C. In the depicted embodiment, an edge WB sensor 200E is placed adjacent the edge on the right-hand side. An edge WB sensors 200E includes an UBM feature 120, a plurality of contact vias 160 that fall within a vertical projection area of the UBM feature 120, and an edge via empty region 300E. The plurality of contact vias 160 that fall within the vertical projection area of the UBM feature 120 are disposed in the plurality of metallization layers in the interconnect structure 106. The edge via empty region 300E is a region of the vertical projection area that do not overlap any contact vias in at least two consecutive metallization layers of the first six metallization layers from the UBM feature 120. The edge via empty region 300E overlaps about one half-circle of the projection area of the UBM feature 120 and is disposed between a geometric center of the UBM feature 120 and a closest edge of the IC chip 102. For example, an edge via empty region 300E near the left side of the IC chip 102 overlaps the majority of the left half-circle of the projection area of the UBM feature 120. An edge via empty regions 300E near the right side of the IC chip 102 overlaps the majority of the right half-circle of the projection area of the UBM feature 120. In some embodiments represented in FIG. 8, the edge via empty region 300E may be rectangular in shape and may expand beyond right half-circle of the projection area of the UBM feature 120.

Figure 9:
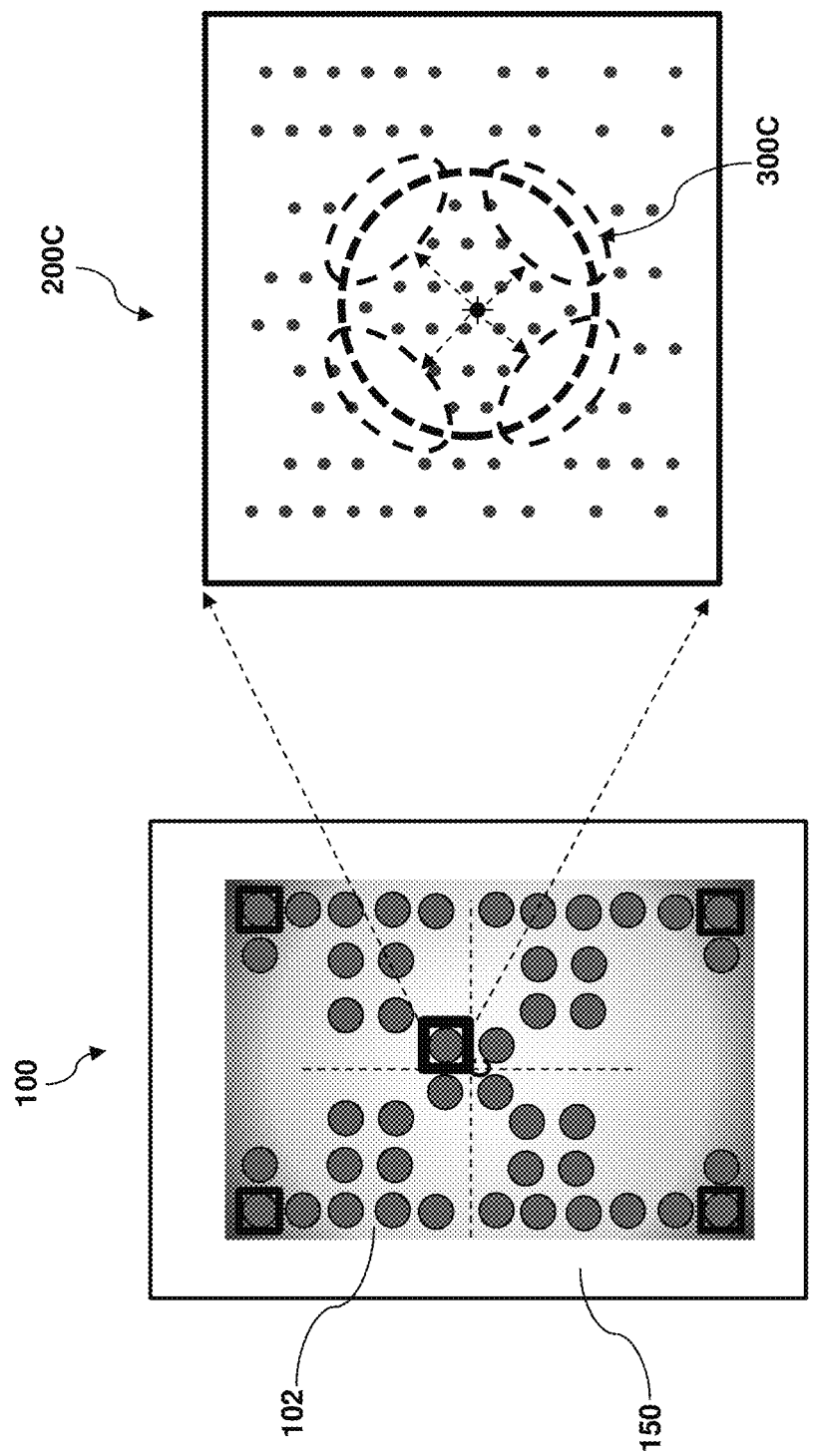

In some embodiments represented in FIG. 9, the semiconductor device package 100 may include a center WB sensor 200C adjacent a geometric center C of the IC chip 102. More than one center WB sensor 200C may be placed around the edges. A center WB sensors 200C of the present disclosure includes an UBM feature 120, a plurality of contact vias 160 that fall within a vertical projection area of the UBM feature 120, and a center via empty region 300C. The plurality of contact vias 160 that fall within the vertical projection area of the UBM feature 120 are disposed in the plurality of metallization layers in the interconnect structure 106. The center via empty region 300C may include multiple polygon shapes regions that are symmetrical with respect to the geometric center C. The center via empty region is a region of the vertical projection area that do not overlap any contact vias in at least two consecutive metallization layers of the first six metallization layers from the UBM feature 120. In the depicted embodiment, the center via empty region 300C includes 4 oval or olive-shaped regions that are symmetrical with respect to the geometric center C.

Figure 10:
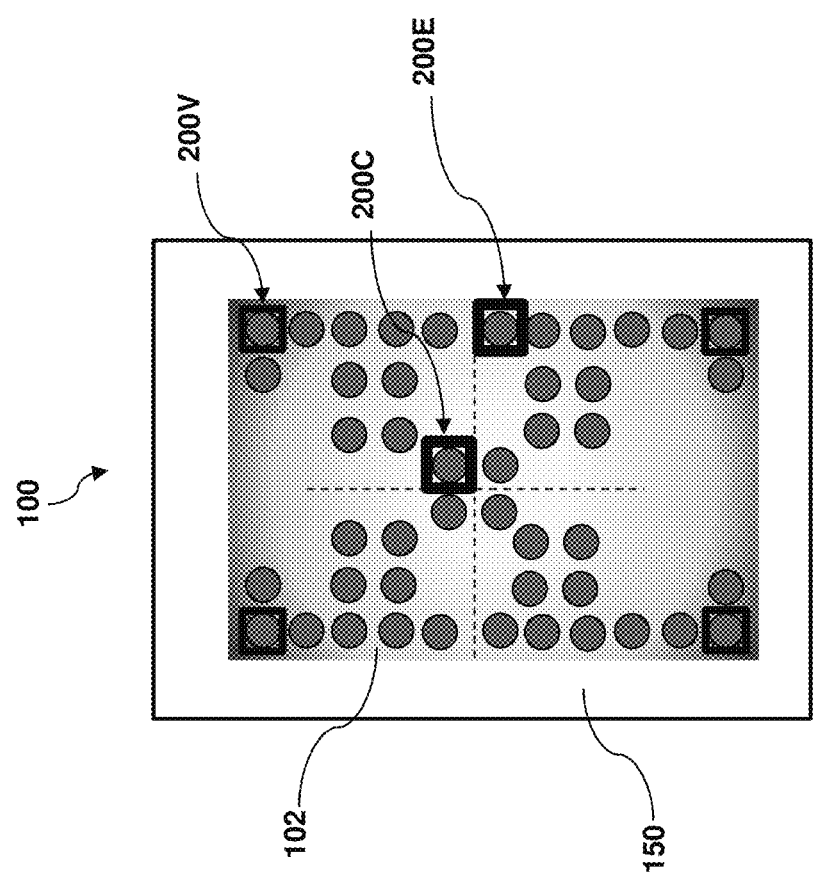

In some embodiments represented in FIG. 10, two or more of the corner WB sensor 200V, edge WB sensor 200E and the center WB sensor 200C may be implemented in one semiconductor device package 100. FIG. 10 illustrates a semiconductor device package 100 that includes all three types of WB sensors but it is understood that a semiconductor device package 100 may include just corner WB sensors 200V and edge WB sensors 200E, or just corner WB sensor 200V and center WB sensor 200C, or just edge WB sensors 200E and center WB sensor 200C. In one embodiment, at least one corner WB sensor 200V is deployed at each of the 4 corners because delamination is most likely found around corners.

Figure 11:
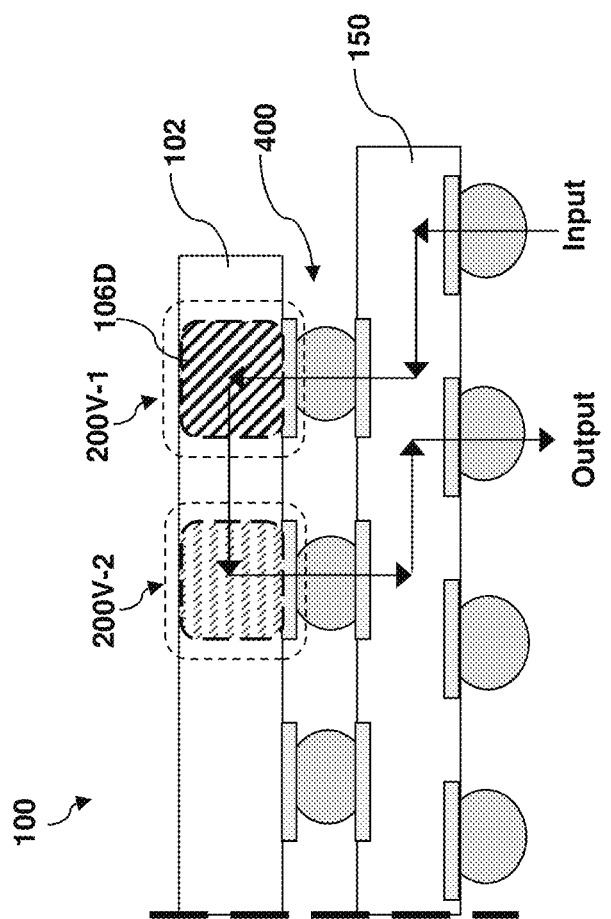
FIG. 11 illustrates an example design-for-testing (DFT) feature that may be implemented with the delamination sensors of the present disclosure.

In some embodiments represented in FIG. 11, the BW sensors of the present disclosure may be integrated with design-for-testing (DFT) features. For example, FIG. 11 illustrates an electrical test loop 400. In the testing loop 400, input signal entering from an input port at the package substrate 150 passes along to a first corner WB sensor 200V-1, then onward to a second corner WB sensor 200V-2, eventually coming out of an output port at the package substrate 150. In the depicted embodiment, when a delamination 106D took place at the first corner WB sensor, probes contacting the input and output ports would detect an open circuit in the electrical test loop 400, indicating that at least one of the first corner WB sensor 200V-1 and the second corner WB sensor 200V-2 is triggered. Other DFT features that include one or more WB sensors are fully envisioned.

Figure 12:
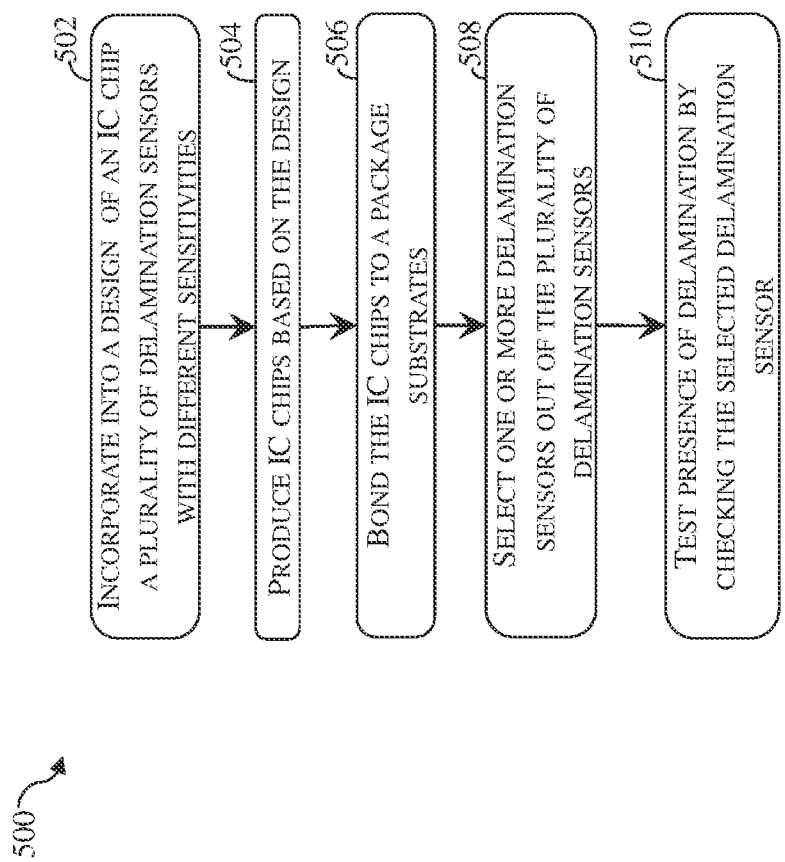
FIG. 12 is a flowchart of a method for testing a semiconductor device package that are equipped with delamination sensors of the present disclosure.

A method 500 of testing a semiconductor device package is illustrated in the flowchart in FIG. 12. The method 500 is merely an example, and is not intended to limit the present disclosure beyond what is explicitly recited in the claims. Additional operations can be provided before, during, and after the method 500, and some operations described can be replaced, eliminated, or moved around for additional embodiments of the method 500. The method 500 will be described in more detail below.

Method 500 includes a block 502 where a plurality of delamination sensors with different sensitivities are incorporated into a design of an IC chip. In lieu of performing a series of experiments and simulations to identify a WB sensor sensitivity level most suitable for an IC chip design, a plurality of WB sensors having different sensitivities are incorporated into a design of an IC chip. As described above, sensitivities of WB sensors of the present disclosure may be adjusted by varying areas (i.e., percentage of the projection area of an UBM feature) and depths (i.e., number of consecutive layers that are free of contact vias) of via empty regions that fall within a projection area of a UBM feature, such as the UBM feature 120 in FIGS. 6, 8, 9, and 10. For example, three corner WB sensors 200V with three different sensitivity levels may be disposed in each of the 4 corners of a rectangular IC chip. For another example, 4 edge WB sensors 200E with four different sensitivity levels may be disposed adjacent each of the four corners of the IC chip. It is noted that the plurality of WB sensors of different sensitivities are such that the IC chip may function properly even when all of them are activated.

Method 500 includes a block 504 where an IC chip is produced based on the design. IC chips produced at block 504 include the plurality of delamination sensors with different sensitivities.

Method 500 includes a block 506 where the IC chips produced at block 504 are bonded to package substrates to form semiconductor device packages.

Method 500 includes a block 508 where one of more delamination sensors are selected out of the plurality of delamination sensors based on initial WB data. At block 508, a pre-determined number of semiconductor device packages produced at block 506 are then subject to full-chip C-SAM to identify white bumps that are part of the WB sensors (i.e., WB-sensor white bumps) and white bumps that are not part of the WB sensors (i.e., non-WB-sensor white bumps). Over the pre-determined number of semiconductor device packages, WB-sensor white bumps and non-WB-sensor white bumps are analyzed to identify a pre-select group of WB-sensor white bumps that are best correlated to occurrence of non-WB-sensor white bumps. Generally speaking, hypersensitive WB sensors are not representative of the quality of the semiconductor device packages and may stand for an unrealistic quality control targets. The goal of operations at block 508 is to find WB sensors that are equally sensitive to the most failure-prone area of the semiconductor device package. The pre-select group of WB sensors may undergo further screening for redundancy to identify a selected group of WB sensors. The selected group of WB sensors may include multiple WB sensors at different locations or just a single WB sensor.

Method 500 includes a block 510 where the presence of delamination is tested by checking the selected group delamination sensor. Except for the pre-determined number of semiconductor device packages that are subject to full-chip C-SAM scans at block 508, the rest of the semiconductor device packages and all to-be-produced semiconductor device packages are tested by checking the selected group of WB sensors of each semiconductor device package. At block 510, the selected group of WB sensors are tested by probing DFT features electrically coupled to the one of the finally selected group of WB sensors, by scanning the selected group of WB sensors using C-SAM, or by doing both. It is noted that, in some embodiments, only one of the electrical testing and the C-SAM is needed to test the selected group of WB sensors. Additionally, because the selected group of WB sensors are representative of the quality of the semiconductor device packages, electrical testing of the finally selected group of WB sensors alone may reliably predict the presence of non-WB-sensor white bumps. If the group of WB sensor is deemed as not representative of the quality of the semiconductor device package, operations at block 508 may repeated to select a different group of WB sensors.

WB sensors and methods of testing delamination in semiconductor device packages of the present disclosure provide several benefits. For example, WB sensors of the present disclosure provide useful test vehicles to cost-effectively gauge how designs of the IC chip and the package substrate may affect occurrence and location of WBs (i.e., local delamination) or even other types of CPI failures. Their tunability allow them to better quantify the ability of a semiconductor device package to withstand CTE mismatch. For another example, once a group of WB sensor has been identified to represent CPI quality of a semiconductor device package is selected, the semiconductor device package can be reliably tested for CPI failures by testing the selected group of WB sensors.

Figure 13:
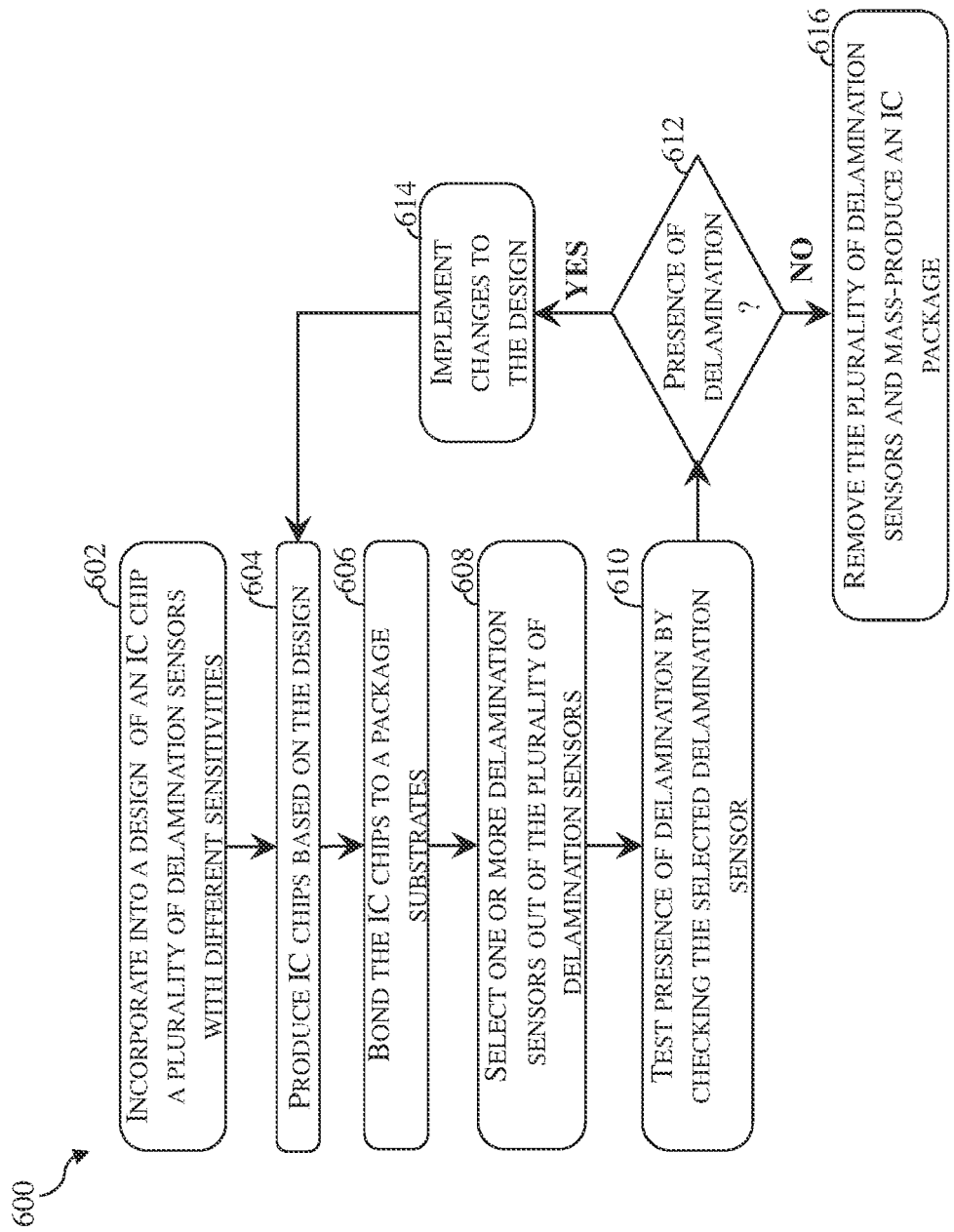
FIG. 13 is a flowchart of a method for designing a semiconductor device package, according to various aspects of the present disclosure.

A method 600 of designing a semiconductor device package is illustrated in the flowchart in FIG. 13. As will be described below, while method 600 share some common operations with method 500, method 600 only uses the plurality of delamination sensors as a design tool and at least some of the delamination sensors are not present in the final structure. The method 600 is merely an example and is not intended to limit the present disclosure beyond what is explicitly recited in the claims. Additional operations can be provided before, during, and after the method 600, and some operations described can be replaced, eliminated, or moved around for additional embodiments of the method 600. The method 600 will be described in more detail below.

Method 600 includes blocks 602, 604, 606, 608, 610, 612, 614, and 616. Out of these blocks, operations in block 602 are similar to those in block 502, operations in block 604 are similar to those in block 504, operations in block 606 are similar to those in block 506, operations in block 608 are similar to those in block 508, operations in block 610 are similar to those in block 510. Due to the similarities, operations in blocks 602, 604, 606, 608, and 610 will not be described in detail.

Method 600 includes a block 612 where a decision whether delamination is present is made. In other words, block 612 is decision block that determines whether changes are to be made in the design to remedy the delamination or whether an IC package is produced without the plurality of delamination sensors. In some embodiments, the decision made at block 612 may be based on a strict presence of any delamination. That is, when any of the plurality of delamination sensor tested at block 610 is triggered, delamination is considered present. In some other embodiments, the decision made at block 612 may be based on a predetermined threshold level. That is, when delamination detected at block 610 reaches the threshold level, delamination is considered present. Conversely, when delamination detected at block 610 falls short of the threshold level, delamination is considered absent. When delamination is present, method 600 proceeds to block 614. When delamination is not present, method 600 proceeds to block 616.

Referring to FIG. 13, method 600 includes a block 614 where changes are implemented to the design. The test result from block 610 indicates where delamination is most likely to take place and the severity of the delamination. Based on that information, changes may be implemented to the design of the IC chip to reinforce bonding between the IC chips and the package substrate. As shown in FIG. 13, IC chips based on the revised design may be produced at block 604. The IC chips based on the revised design may go through operations at block 606, 608, and 610 to determine if the delamination has been addressed. If not, the loop may be repeated until no delamination is present or delamination falls below the predetermined threshold level.

As shown in FIG. 13, method 600 includes a block 616 where the plurality of delamination sensors are removed and an IC package is produced. When no delamination is determined to be present at block 612, at least a portion of the plurality of delamination sensors may be removed to generate a final design and IC chips and IC packages are mass-produced based on the final design. The removal of the plurality of delamination sensors may be based on how the presence of the plurality of delamination sensors affects the cost yield, and functionality of the IC package. For example, when the removal improves yield or process window, the plurality of delamination sensors will be removed. When the removal increases cost, the plurality of delamination sensors will not be removed. In some instances, only a portion of the plurality of delamination sensors is removed.

In one embodiment, the present disclosure provides a method. The method includes providing a semiconductor device package that includes a package substrate, a semiconductor device over the package substrate, and at least one delamination sensor. The semiconductor device includes an interconnect structure and the interconnect structure includes a plurality of metallization layers disposed in a dielectric layer. The at least one delamination sensor includes a connecting structure bonding the semiconductor device to the package substrate, and a plurality of contact vias in at least one of the plurality of metallization layers. The plurality of contact vias fall within a first region of a vertical projection area of the connecting structure but do not overlap a second region of the vertical projection area. The method further includes screening an entirety of the semiconductor device package for delamination by testing only the at least one delamination sensor.

In some embodiments, the at least one delamination sensor includes a plurality of delamination sensors with different sensitivities. In some implementations, the dielectric layer includes a dielectric material having a dielectric constant smaller than 2.7. In some instances, the connecting structure is adjacent a corner of the semiconductor device. In some embodiments, the vertical projection area is circular and includes a center and the second region is disposed between the center and the corner of the semiconductor device.

In another embodiment, the present disclosure also provides a method. The method includes providing a semiconductor device package that includes a package substrate, a semiconductor device over the package substrate, and at least one delamination sensor. The semiconductor device includes an interconnect structure and the interconnect structure includes a plurality of metallization layers disposed in a dielectric layer. The at least one delamination sensor includes a connecting structure bonding the semiconductor device to the package substrate, and a plurality of contact vias in at least one of the plurality of metallization layers. The plurality of contact vias fall within a first region of a vertical projection area of the connecting structure but do not overlap a second region of the vertical projection area. The method further includes screening an entirety of the semiconductor device package for delamination by testing only the at least one delamination sensor. When delamination is present during the screening, the method includes implementing changes to the semiconductor device to form a revised semiconductor device. When delamination is not present during the screening, the method further includes mass-producing the semiconductor device.

In some embodiments, the method further includes after the implementing of changes, providing a revised semiconductor device package that includes another substrate, and the revised semiconductor device that includes at least one delamination sensor. The method may further include screening an entirety of the revised semiconductor device package for delamination by testing only the at least one delamination sensor. In some embodiments, the changes implemented are based on the delamination identified during the screening. In some implementations, the connecting structure is adjacent a corner of the semiconductor device. In some instances, the connecting structure is an under-bump metallization (UBM) structure.

In yet another embodiment, the present disclosure provides a semiconductor structure. The semiconductor structure includes a package substrate, a semiconductor device over the package substrate, and a delamination sensor. The semiconductor device includes an interconnect structure, and the interconnect structure includes a plurality of metallization layers disposed in a dielectric layer. The delamination sensor includes a connecting structure bonding the semiconductor device to the package substrate, and a plurality of contact vias in at least one of the plurality of metallization layers. The plurality of contact vias fall within a first region of a vertical projection area of the connecting structure but do not overlap a second region of the vertical projection area.

In some embodiments, the dielectric layer is an extreme low-k dielectric layer with a dielectric constant smaller than 2.7. In some implementations, the dielectric layer is porous. In some embodiments, the connecting structure is adjacent a corner of the semiconductor device. In some instances, the vertical projection area is circular and includes a center and the second region is disposed between the center and the corner of the semiconductor device. In some embodiments, the connecting structure is adjacent an edge of the semiconductor device. In some embodiments, the vertical projection area is circular and includes a center and the second region is disposed between the center and the edge of the semiconductor device. In some instances, the connecting structure is adjacent a geometric center of the semiconductor device. In some embodiments, the vertical projection area is circular and includes a center and the second region is symmetrical with respect to the center. In some embodiments, the connecting structure is an under-bump metallization (UBM) structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method, comprising:
  providing a semiconductor device package that comprises:
    a package substrate,
    a semiconductor device over the package substrate, wherein the semiconductor device comprises an interconnect structure and the interconnect structure comprises a plurality of metallization layers disposed in a dielectric layer, and
    at least one delamination sensor comprising:
      a connecting structure bonding the semiconductor device to the package substrate, and
      a plurality of contact vias in at least one of the plurality of metallization layers, wherein the plurality of contact vias fall within a first region of a vertical projection area of the connecting structure but do not overlap a second region of the vertical projection area; and
  screening an entirety of the semiconductor device package for delamination by testing only the at least one delamination sensor.

2. The method of claim 1, wherein the at least one delamination sensor comprises a plurality of delamination sensors with different sensitivities.

3. The method of claim 1, wherein the dielectric layer comprises a dielectric material having a dielectric constant smaller than 2.7.

4. The method of claim 1, wherein the connecting structure is adjacent a corner of the semiconductor device.

5. The method of claim 4,
wherein the vertical projection area is circular and comprises a center,
wherein the second region is disposed between the center and the corner of the semiconductor device.

6. A method, comprising:
providing a semiconductor device package that comprises:
a package substrate,
a semiconductor device over the package substrate, wherein the semiconductor device comprises an interconnect structure and the interconnect structure comprises a plurality of metallization layers disposed in a dielectric layer, and
at least one delamination sensor comprising:
a connecting structure bonding the semiconductor device to the package substrate, and
a plurality of contact vias in at least one of the plurality of metallization layers, wherein the plurality of contact vias fall within a first region of a vertical projection area of the connecting structure but do not overlap a second region of the vertical projection area;
screening an entirety of the semiconductor device package for delamination by testing only the at least one delamination sensor;
when delamination is present during the screening, implementing changes to the semiconductor device to form a revised semiconductor device; and
wherein delamination is not present during the screening, mass-producing the semiconductor device.

7. The method of claim 6, further comprising:
after the implementing of changes, providing a revised semiconductor device package that comprise:
another substrate, and
the revised semiconductor device that comprises at least one delamination sensor; and
screening an entirety of the revised semiconductor device package for delamination by testing only the at least one delamination sensor.

8. The method of claim 6, wherein the changes implemented are based on the delamination identified during the screening.

9. The method of claim 6, wherein the connecting structure is adjacent a corner of the semiconductor device.

10. The method of claim 6, wherein the connecting structure is an under-bump metallization (UBM) structure.

11. A semiconductor structure, comprising:
a package substrate;
a semiconductor device over the package substrate, wherein the semiconductor device comprises an interconnect structure, and the interconnect structure comprises a plurality of metallization layers disposed in a dielectric layer; and
a delamination sensor comprising:
a connecting structure bonding the semiconductor device to the package substrate, and
a plurality of contact vias in at least one of the plurality of metallization layers, wherein the plurality of contact vias fall within a first region of a vertical projection area of the connecting structure but do not overlap a second region of the vertical projection area.

12. The semiconductor structure of claim 11, wherein the dielectric layer is an extreme low-k dielectric layer with a dielectric constant smaller than 2.7.

13. The semiconductor structure of claim 11, wherein the dielectric layer is porous.

14. The semiconductor structure of claim 11, wherein the connecting structure is adjacent a corner of the semiconductor device.

15. The semiconductor structure of claim 14,
wherein the vertical projection area is circular and comprises a center,
wherein the second region is disposed between the center and the corner of the semiconductor device.

16. The semiconductor structure of claim 11, wherein the connecting structure is adjacent an edge of the semiconductor device.

17. The semiconductor structure of claim 16,
wherein the vertical projection area is circular and comprises a center,
wherein the second region is disposed between the center and the edge of the semiconductor device.

18. The semiconductor structure of claim 11, wherein the connecting structure is adjacent a geometric center of the semiconductor device.

19. The semiconductor structure of claim 18,
wherein the vertical projection area is circular and comprises a center,
wherein the second region is symmetrical with respect to the center.

20. The semiconductor structure of claim 11, wherein the connecting structure is an under-bump metallization (UBM) structure.

* * * * *